(12) United States Patent
Uetsuji et al.

(10) Patent No.: US 11,973,309 B2
(45) Date of Patent: Apr. 30, 2024

(54) SEMICONDUCTOR CHIP MANUFACTURING DEVICE AND METHOD OF MANUFACTURING SEMICONDUCTOR CHIPS

(71) Applicant: Mitsubishi Electric Corporation, Tokyo (JP)

(72) Inventors: Tetsuya Uetsuji, Tokyo (JP); Ayumi Fuchida, Tokyo (JP); Masato Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 436 days.

(21) Appl. No.: 17/283,104

(22) PCT Filed: Mar. 7, 2019

(86) PCT No.: PCT/JP2019/009081
§ 371 (c)(1),
(2) Date: Apr. 6, 2021

(87) PCT Pub. No.: WO2020/179057
PCT Pub. Date: Sep. 10, 2020

(65) Prior Publication Data
US 2021/0391684 A1    Dec. 16, 2021

(51) Int. Cl.
*H01S 5/02*  (2006.01)
*B28D 5/00*  (2006.01)

(52) U.S. Cl.
CPC .......... *H01S 5/0202* (2013.01); *B28D 5/0011* (2013.01); *B28D 5/0047* (2013.01); *B28D 5/0052* (2013.01)

(58) Field of Classification Search
CPC .... B23K 26/53; B23K 26/364; B23K 26/359; H01L 21/78; H01L 21/67057; B08B 3/04; B28D 5/0076; B28D 5/0011; H01S 5/0202
See application file for complete search history.

(56) References Cited

U.S. PATENT DOCUMENTS 5,208,468 A   5/1993 Kawanishi et al.
5,260,231 A   11/1993 Kawanishi et al.
(Continued)

FOREIGN PATENT DOCUMENTS

CN    105082242 A    11/2015
JP    H02-132844 A    5/1990
(Continued)

OTHER PUBLICATIONS

International Search Report issued in PCT/JP2019/009081; dated May 14, 2019.
(Continued)

*Primary Examiner* — Alia Sabur
(74) *Attorney, Agent, or Firm* — Studebaker & Brackett PC

(57) ABSTRACT

In a semiconductor chip manufacturing device which produces a plurality of LD chips by dividing a semiconductor wafer, being placed in a casing in which a fluid medium is filled, on which a block line is formed in advance and also on which a scribed line is inscribed so that a microcrack is formed along the scribed line, the semiconductor chip manufacturing device comprises a reception stage for supporting the semiconductor wafer, and a blade cutting-edge for pressurizing the semiconductor wafer along its crack portion made of the block line or the scribed line, so that the semiconductor wafer is divided into a plurality of LD chips (Continued)

by pressurizing it by means of the blade cutting-edge along the crack portion in the fluid medium.

10 Claims, 6 Drawing Sheets

(56) References Cited

U.S. PATENT DOCUMENTS

| | | | |
|---|---|---|---|
| 2007/0298529 A1* | 12/2007 | Maeda | B23K 26/0624 |
| | | | 438/33 |
| 2011/0064100 A1* | 3/2011 | Raring | B82Y 20/00 |
| | | | 372/45.01 |
| 2012/0009762 A1* | 1/2012 | Tamboli | C11D 11/0047 |
| | | | 252/396 |
| 2015/0357241 A1* | 12/2015 | Doub | H01L 21/6836 |
| | | | 438/462 |
| 2017/0036367 A1 | 2/2017 | Deng et al. | |

FOREIGN PATENT DOCUMENTS

| | | | |
|---|---|---|---|
| JP | H03-224284 A | | 10/1991 |
| JP | 04180651 A | * | 6/1992 |
| JP | H04-180651 A | | 6/1992 |
| JP | H05-102302 A | | 4/1993 |
| JP | H05-299769 A | | 11/1993 |
| JP | H05-304339 A | | 11/1993 |
| JP | 2002-289963 A | | 10/2002 |
| JP | 2002-373868 A | | 12/2002 |
| JP | 2007-136482 A | | 6/2007 |
| JP | 2007149860 A | * | 6/2007 |
| JP | 2012-183590 A | | 9/2012 |
| JP | 2015-226018 A | | 12/2015 |
| KR | 0123470 | * | 2/1999 |

OTHER PUBLICATIONS

An Office Action; "Notice of Reasons for Refusal", mailed by the Japanese Patent Office dated Sep. 7, 2021, which corresponds to Japanese Patent Application No. 2021-503370 and is related to U.S. Appl. No. 17/283,104; with English language translation.

An Office Action issued by the State Intellectual Property Office of the People's Republic of China dated Dec. 13, 2023, which corresponds to Chinese Patent Application No. CN 201980076194.4.

* cited by examiner

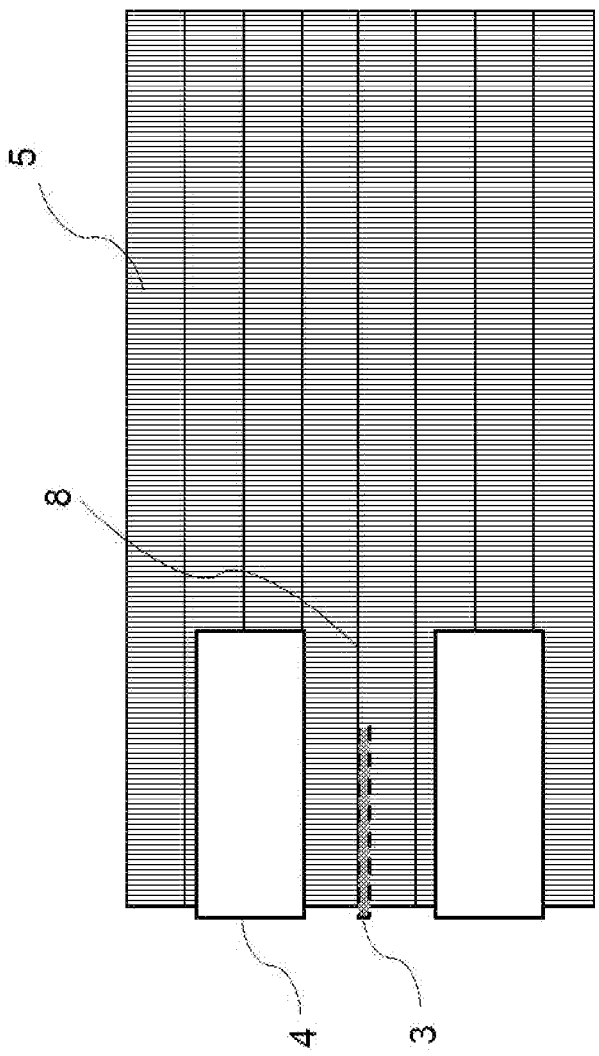
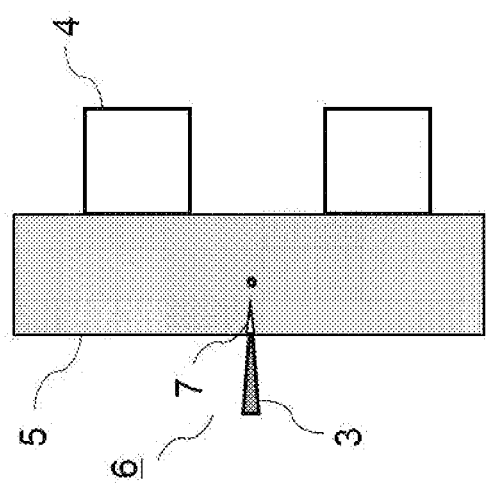
FIG. 3A
FIG. 3B

SEMICONDUCTOR CHIP MANUFACTURING DEVICE AND METHOD OF MANUFACTURING SEMICONDUCTOR CHIPS

TECHNICAL FIELD

The present disclosure of the application concerned relates to a semiconductor chip manufacturing device and a method of manufacturing semiconductor chips.

BACKGROUND ART

In a case in which a semiconductor wafer is divided into semiconductor chips each as functional devices therefrom, its three processes, namely, an affixation process step of a semiconductor wafer, a separation process step thereof and an expansion process step thereof can be categorized, and each of process steps carries individually an important role (for example, refer to Patent Documents 1 to 3).

First, an affixation process step of a semiconductor wafer is a process step by which a semiconductor wafer is affixed onto an adhesive sheet; however, the adhesive sheet results in not only carrying the support of the semiconductor wafer in a simple manner, but also carrying the support of semiconductor chips after their separation in the semiconductor wafer. Therefore, the adhesive sheet is important, so that the adhesive sheet is selected by verifying the contamination of semiconductor chip's surfaces having been affixed by means of an adhesive sheet material, an influence on separation quality, capabilities to suitably support the semiconductor chips and also to easily pick up them, and so forth.

Next, the explanation will be made for a separation process step. In a case for separation cross-sections of a semiconductor wafer in which their smoothness is not required, a microcrack (very small crack) is formed in a direction along a scribed (being scribed) line by introducing the scribed line on the semiconductor wafer by means of a diamond tool along the line being intended for the separation (usually, on a semiconductor wafer, a boundary line(s) being visually identifiable is formed). Next, by applying stress so that the very small crack is to be opened, the very small crack is developed, so that the semiconductor wafer is separated. Note that, hereinafter, the method is referred to as a "scribing method."

It should be noted that in order to prevent chipping being caused at the time when a diamond tool has contact with a semiconductor wafer's end(s), a scribed line is not introduced into the line being intended for the separation in its entirety (for example, refer to Patent Document 2), but a starting point of the scribed line and an endpoint thereof are each set in the inner lateral side(s) from the semiconductor wafer's end(s) to some extent.

In the scribing method described above, because an influence of thermal stress caused by means of the machining is lower and so forth in comparison with the separation by means of a rotating blade or laser machining, a crack being caused with respect to the semiconductor wafer can be curbed, and, as a result, the strength of laser-diode (hereinafter, referred to as an "LD," for brevity) chips having been divided can be set higher; and thus, the method is an effective technique in particular in a case of a fragile or brittle semiconductor wafer material.

In a case for an LD end face(s) whose smoothness is required for its separation cross-sections, a scribed (being scribed) line is introduced by means of a diamond tool along a line being intended for the separation and also on one side of semiconductor wafer's ends or both sides thereof (for example, refer to Patent Document 4), whereby a microcrack (very small crack) is formed in a direction along the scribed line.

Furthermore, the semiconductor wafer has a cleavage plane to be likely to be separated (for example, refer to Patent Document 2, and Patent Documents 4 to 7); and thus, it is necessary to set the scribed line to be in parallel with the cleavage plane in the direction thereof. By applying stress in a direction to open a very small crack having been formed by means of scribing, the very small crack grows along a cleavage plane, so that cleavage planes each having the smoothness in the level of atoms are formed.

According to the process steps described above, the semiconductor wafer is divided into LD bars in bar shapes, or into LD chips where the LD chips each having cleavage planes are arrayed side by side.

RELATED ART DOCUMENTS

Patent Documents

[Patent Document 1] Japanese Patent Laid-Open No. 2002-373868
[Patent Document 2] Japanese Patent Laid-Open No. 2012-183590
[Patent Document 3] Japanese Patent Laid-Open No. H02-132844
[Patent Document 4] Japanese Patent Laid-Open No. H05-304339
[Patent Document 5] Japanese Patent Laid-Open No. H05-299769
[Patent Document 6] Japanese Patent Laid-Open No. 2002-289963
[Patent Document 7] Japanese Patent Laid-Open No. H03-224284

SUMMARY OF THE INVENTION

Problems to be Solved by the Invention

As described above, in a process step for dividing a semiconductor wafer into functional device chips, there arises a problem in that, for example, at the time when the separation from a semiconductor wafer having a crystalline substance of sphalerite or zinc blende is performed by dividing it into the states of LD bars or into the states of LD chips in those of which a plurality of LD chips is aligned side by side, foreign substance of a semiconductor(s) having been caused adheres onto end faces of LD chips, whereby, at the time of visual inspection of end faces of the LD chips, a visual defect is caused due to the foreign substance.

The present disclosure in the application concerned has been directed at disclosing technologies for solving those problems as described above, an object of the disclosure is to provide a semiconductor chip manufacturing device and a method of manufacturing semiconductor chips in each of which the adhesion of foreign substance onto end faces of LD chips is curbed at the time when a semiconductor wafer is divided into LD bar states or into LD chip states so that the foreign substance is caused; according to this arrangement, the reduction of causing a visual defect due to the foreign substance is achieved at a visual inspection process step of end faces of the LD chips.

Means for Solving the Problems

A semiconductor chip manufacturing device disclosed in the disclosure of the application concerned is a semiconductor chip manufacturing device which produces a plurality of LD chips by dividing a semiconductor wafer, being placed inside of a casing in which a fluid medium is filled, on which a visually identifiable block line is formed in advance and also on which a scribed line is inscribed so that a microcrack is formed along the scribed line, and the semiconductor chip manufacturing device comprises:
- a mechanism for generating a flow of gaseous fluid to flow in the fluid medium along the scribed line;
- a blade cutting-edge for pressurizing a surface of the semiconductor wafer along a crack portion made of the block line of the semiconductor wafer or the scribed line thereof; and
- a reception stage for supporting the semiconductor wafer on a surface on the opposite side to a surface where the blade cutting-edge pressurizes the semiconductor wafer, wherein
- the semiconductor wafer is divided into a plurality of LD chips by pressurizing, by means of the blade cutting-edge, the semiconductor wafer along a crack portion thereof in the fluid medium.

In addition, a method of manufacturing semiconductor chips disclosed in the disclosure of the application concerned is a method of manufacturing semiconductor chips by which a plurality of LD chips is produced by dividing a semiconductor wafer on which a visually identifiable block line is formed in advance and also on which a scribed line is inscribed so that a microcrack is formed along the scribed line; and, in the method of manufacturing semiconductor chips,
- the semiconductor wafer is supported by means of a reception stage in a casing, inside of which a fluid medium is filled and a blade cutting-edge is placed along a crack portion made of the block line of the semiconductor wafer or the scribed line thereof, and a flow of gaseous fluid is generated to flow in the fluid medium along the scribed line, and also
- the semiconductor wafer is divided into a plurality of LD chips by pressurizing, by the blade cutting-edge, the semiconductor wafer along a crack portion thereof in the fluid medium.

Effects of the Invention

According to the semiconductor chip manufacturing device disclosed in the disclosure of the application concerned or the method of manufacturing semiconductor chips disclosed therein, the adhesion of foreign substance onto end faces of LD chips can be curbed at the time when a semiconductor wafer is divided into LD bar states or into LD chip states so that the foreign substance is caused; according to this arrangement, it becomes possible to reduce causing a visual defect at a visual inspection process step of end faces of the LD chips.

BRIEF DESCRIPTION OF DRAWINGS

FIGS. 3-3A and 3B are a side view and a plan view illustrating the principal parts of another semiconductor chip manufacturing device according to Embodiment 1, respectively;

EMBODIMENTS FOR CARRYING OUT THE INVENTION

Figure 1:
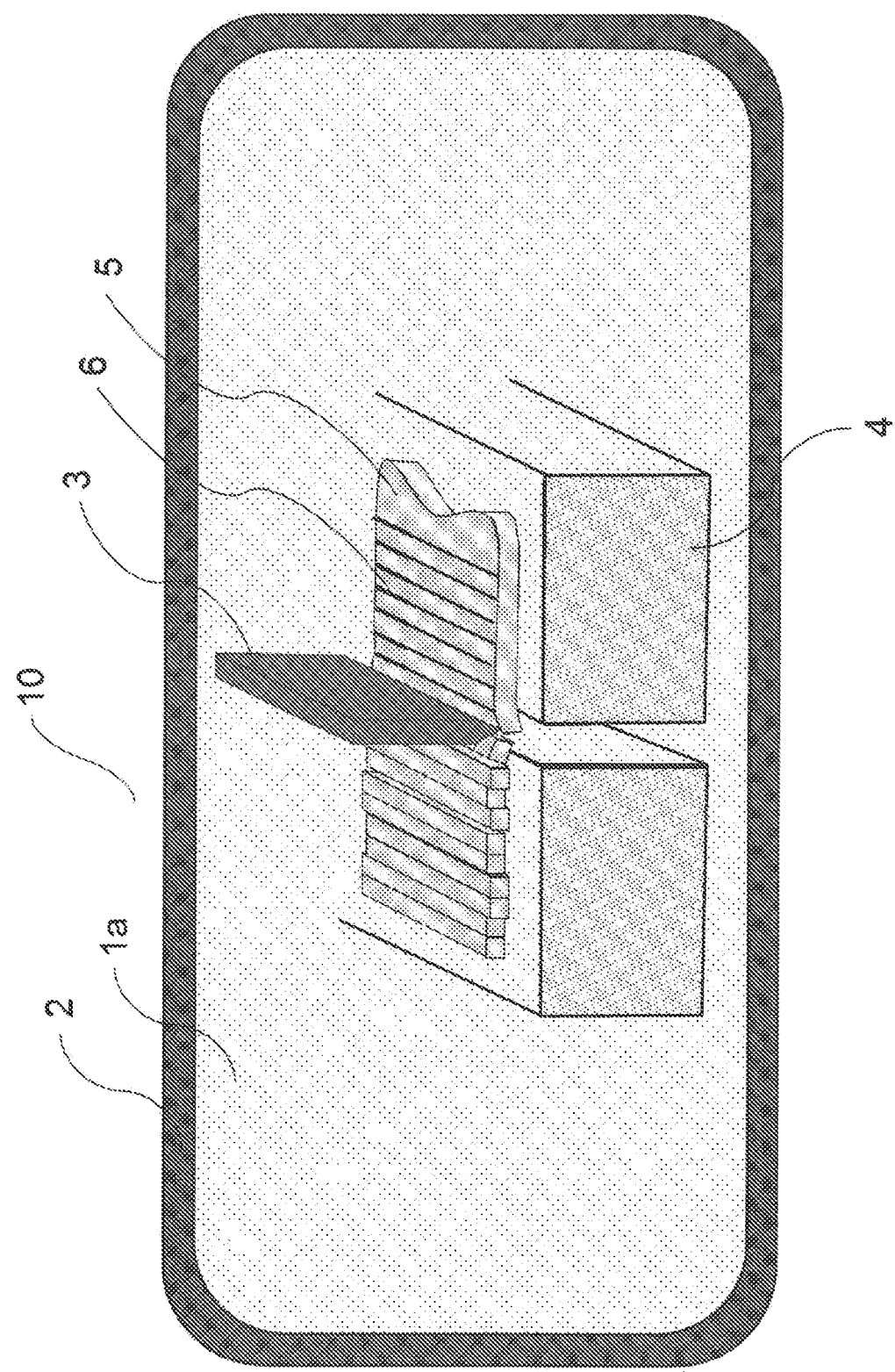
FIG. 1 is a conceptual diagram outlining an example of a semiconductor chip manufacturing device according to Embodiment 1.

The disclosure of the application concerned relates to semiconductor chip manufacturing devices and their manufacturing methods. To be more specific, the disclosure relates to manufacturing devices of semiconductor laser devices and their manufacturing methods, and, for example, relates to technologies for manufacturing semiconductor chips in which a semiconductor wafer is divided thereinto, at the time when the separation from the semiconductor wafer made of a crystalline substance of sphalerite or zinc blende is performed by dividing it into bar states in which a plurality of LD chips is aligned side by side, by applying force onto a very small crack using a cutting-edge referred to as a blade, and by utilizing cleavage of the crystalline substance while defining the very small crack formed inside the crystalline substance as a starting point.

Embodiment 1

Hereinafter, the explanation will be made referring to the drawings for semiconductor chip manufacturing devices and their manufacturing methods according to Embodiment 1. Note that, the same reference numerals and symbols designate below the same or corresponding constituent elements; thus, there arises a case in which the repetition of their explanation may be omitted.

FIG. 1 is a conceptual diagram outlining an example of a semiconductor chip manufacturing device according to Embodiment 1 in which semiconductor chips are manufactured from a semiconductor wafer 5 by utilizing cleavage of crystal.

FIG. 1 shows one example of a semiconductor chip manufacturing device 10 covered by a casing 2 which is filled in a liquid or a fluid medium (here, the fluid medium means "water" 1a), at the time when the separation from the semiconductor wafer 5 is performed by dividing it into a bar or a LD chip on a unit basis in each of which a plurality of LD chips is aligned side by side, by pressurizing or by applying pressure by means of a blade cutting-edge 3 onto a crack portion 6 (here in particular, concentrated force is applied onto the corresponding portion, which is applicable hereinafter in a similar fashion) and by utilizing cleavage of crystal while defining a very small crack formed inside the crystal of the semiconductor wafer 5 as a starting point. As shown in FIG. 1, the device is an apparatus which manufactures semiconductor chips by means of dividing the semiconductor wafer 5 thereinto, using reception stages 4, by applying pressure onto the crack portion 6 by the blade cutting-edge 3 and by utilizing cleavage of crystal while defining the crack portion 6 formed inside the crystal of the semiconductor wafer 5 as a starting point.

Figure 2B:
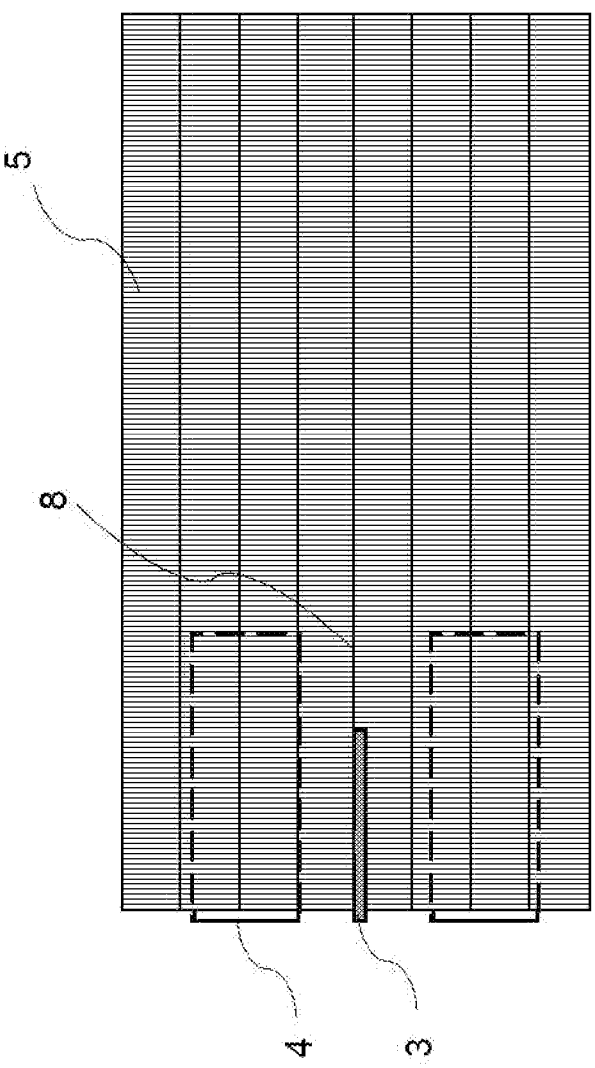
FIGS. 2A and 2B are a side view and a plan view illustrating the principal parts of the semiconductor chip manufacturing device according to Embodiment 1.
Figure 2A:
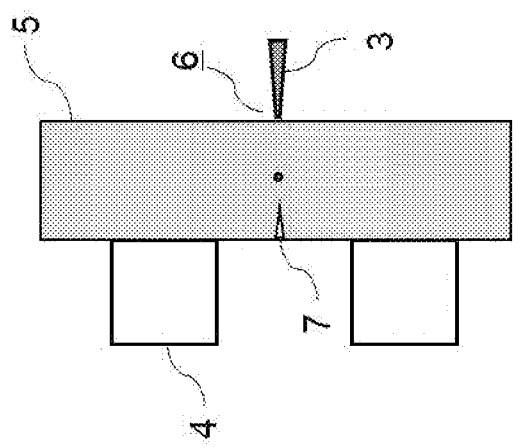

Here, the explanation will be made referring to FIGS. 2A and 2B and FIGS. 3A and 3B in more detail for the crack portion 6 described above. FIG. 2A is a side view illustrating the principal parts of the semiconductor chip manufacturing device according to Embodiment 1, and FIG. 2B is a plan view illustrating the principal parts of the semiconductor chip manufacturing device according to Embodiment 1. In these figures, the semiconductor wafer 5 is supported on its one surface by the two reception stages 4, and is also pressurized on its surface on the opposite side to the one surface by means of the blade cutting-edge 3.

In this case, as shown in FIG. 2A, a scribed line 7 is inscribed on the surface supported by the reception stages of the semiconductor wafer 5, and also, formed is a microcrack being shown in the middle portion of the semiconductor wafer 5 by a small circular mark as a representative of the microcrack. In addition, as shown in FIG. 2B, the blade cutting-edge 3 produces a plurality of LD chips by applying pressure onto the semiconductor wafer 5 from the outside of the semiconductor wafer 5 along a block line 8 which is formed being visually identifiable, so that the semiconductor wafer 5 is divided.

Note that, at the time when the blade cutting-edge 3 pressurizes the semiconductor wafer 5, pressure is applied from the right side of the semiconductor wafer 5 toward the left-hand direction in FIG. 2A; namely, in FIG. 2A, pressure is horizontally applied, being directed in the direction of the scribed line 7, externally from the semiconductor wafer 5.

And then, in the semiconductor chip manufacturing device shown in FIG. 2A and FIG. 2B, the crack portion 6 means the block line 8 shown in FIG. 2B.

There also arises a case in which a semiconductor chip manufacturing device takes on a configuration shown in FIGS. 3A and 3B, other than the case of the configuration as in FIG. 2A and FIG. 2B. For dealing therewith, next, the explanation will be made in detail for the crack portion 6 in the case of the semiconductor chip manufacturing device in the form illustrated in FIGS. 3A and 3B.

FIG. 3A is a side view illustrating the principal parts of another semiconductor chip manufacturing device according to Embodiment 1, and FIG. 3B is a plan view illustrating the principal parts of said another semiconductor chip manufacturing device according to Embodiment 1.

In the semiconductor chip manufacturing device, differing from the semiconductor chip manufacturing device shown in FIG. 2A and FIG. 2B, the scribed line 7 is inscribed on a surface on the opposite side to a surface where the reception stages of the semiconductor wafer 5 support, as shown in FIG. 3A. In addition, as shown in FIG. 3B, the blade cutting-edge 3 produces a plurality of LD chips by applying pressure onto the semiconductor wafer 5 from the outside of the semiconductor wafer 5 along the scribed line 7 so that the semiconductor wafer 5 is divided, which is also different from the case of the semiconductor chip manufacturing device shown in FIG. 2A and FIG. 2B.

It should be noted that, in regard to the points other than those points described above, the same applies thereto as those in the cases in FIG. 2A and FIG. 2B. For example, in regard to the point in which a microcrack being shown in the middle portion of the semiconductor wafer 5 by a small circular mark as a representative of the microcrack is formed, the same applies thereto as that in the case in FIG. 2A.

Note that, at the time when the blade cutting-edge 3 pressurizes the semiconductor wafer 5, pressure is applied from the left side of the semiconductor wafer 5 toward the right-hand direction in FIG. 3A; namely, in FIG. 3A, pressure is horizontally applied, being directed in a direction of the block line 8 not shown in the figure (refer to FIG. 3B), externally from the semiconductor wafer 5.

And then, in the semiconductor chip manufacturing device shown in FIG. 3A and FIG. 3B, the crack portion 6 means the scribed line 7 shown in FIG. 3A.

As explained above, in the semiconductor chip manufacturing devices according to Embodiment 1, end faces of a semiconductor wafer reside in the fluid medium; and thus, the adhesion of foreign substance onto the end faces of the semiconductor wafer can be curbed at the time when the semiconductor wafer is divided into LD bars or into LD chips in which a plurality of LD chips is aligned side by side so that the foreign substance is caused.

And then, by producing LD chips by means of the semiconductor chip manufacturing devices according to Embodiment 1, it becomes possible to reduce causing a visual defect due to the adhesion of foreign substance on end faces of the LD chips at a time of visual inspection thereon.

Embodiment 2

Figure 4:
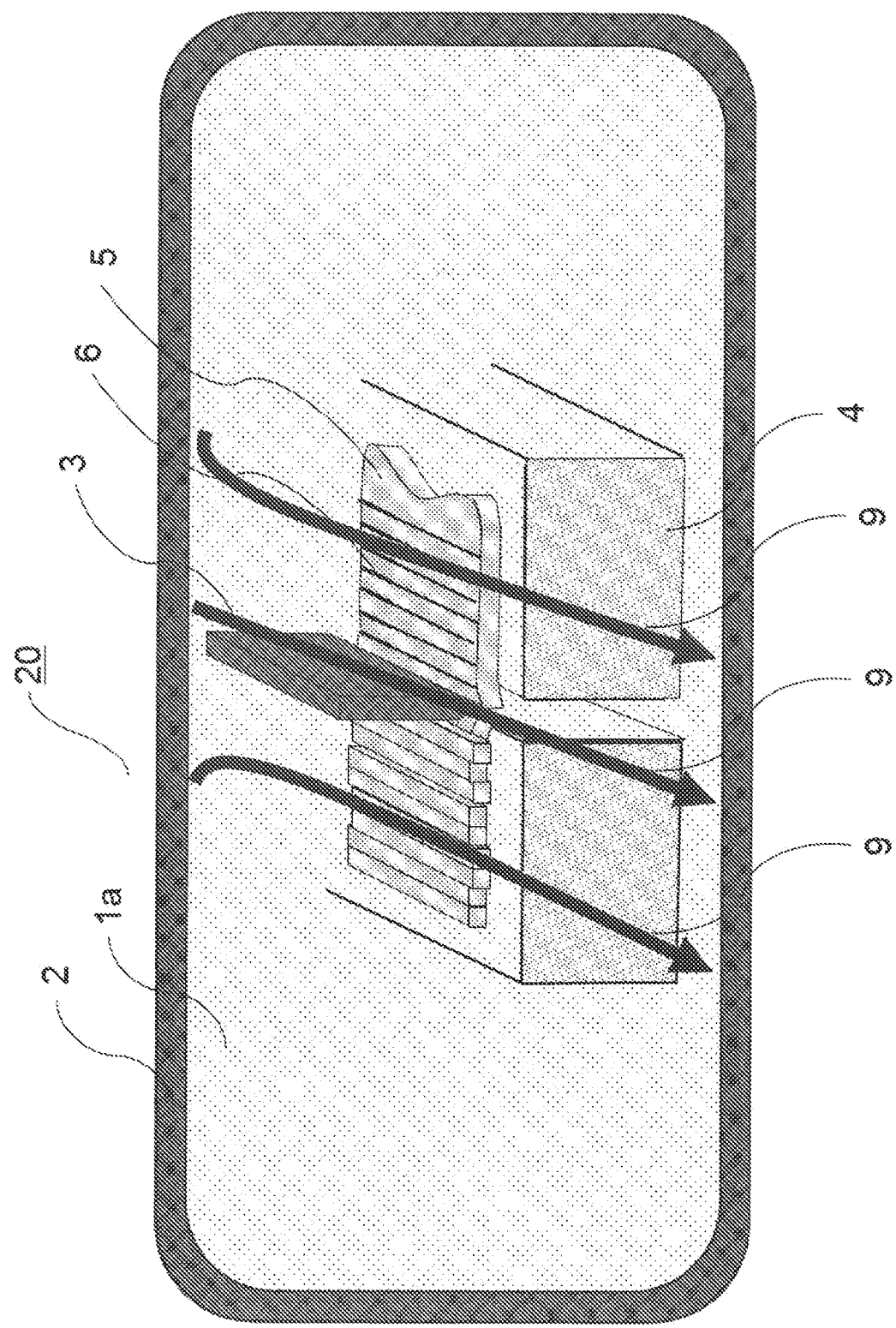
FIG. 4 is a conceptual diagram outlining an example of a semiconductor chip manufacturing device according to Embodiment 2.

FIG. 4 is a conceptual diagram outlining an example of a semiconductor chip manufacturing device according to Embodiment 2 in which semiconductor chips are manufactured from the semiconductor wafer 5 by using cleavage of crystal.

To be specific, the manufacturing device is an apparatus for manufacturing semiconductor chips by applying pressure onto the crack portion 6 using a blade cutting-edge and by utilizing cleavage of crystal while defining a crack formed inside the crystal as a starting point; and, in the semiconductor chip manufacturing device 20 that is covered by the casing 2 in which a liquid or a fluid medium (for example, the water 1a) is filled, and at the time when the separation from a semiconductor wafer is performed by dividing it into bar states or into LD chips in which a plurality of LD chips is aligned side by side, the figure shows the semiconductor chip manufacturing device by which the semiconductor wafer is divided into its portions, while the semiconductor wafer 5 is supported by the reception stages 4, by applying pressure onto the crack portion 6 by means of the blade cutting-edge 3 and by utilizing cleavage of crystal while defining a crack formed inside the crystal as a starting point. In particular, for the purpose of preventing the adhesion of foreign substance of a semiconductor(s) being caused, a feature resides in the structure that comprises a mechanism for generating gaseous streams, or flows of gaseous fluid, 9 within the fluid medium.

In the semiconductor chip manufacturing device according to Embodiment 2, end faces of LD chips reside in the fluid medium; and thus, the adhesion of foreign substance onto end faces of the LD chips is curbed at the time when the separation from a semiconductor wafer is performed by dividing it into LD bar states or into LD chips in which a plurality of LD chips is aligned side by side so that the foreign substance is caused. In addition, by means of a gaseous stream(s) or a flow(s) of gaseous fluid being generated, the foreign substance is ejected toward an exhaust port being mounted; and thus, the adhesion onto end faces of the LD chips is curbed.

By producing LD chips by means of the semiconductor chip manufacturing device according to Embodiment 2, it becomes possible to reduce causing a visual defect due to the adhesion of foreign substance on end faces of the LD chips at a time of visual inspection thereon.

Embodiment 3

Figure 5:
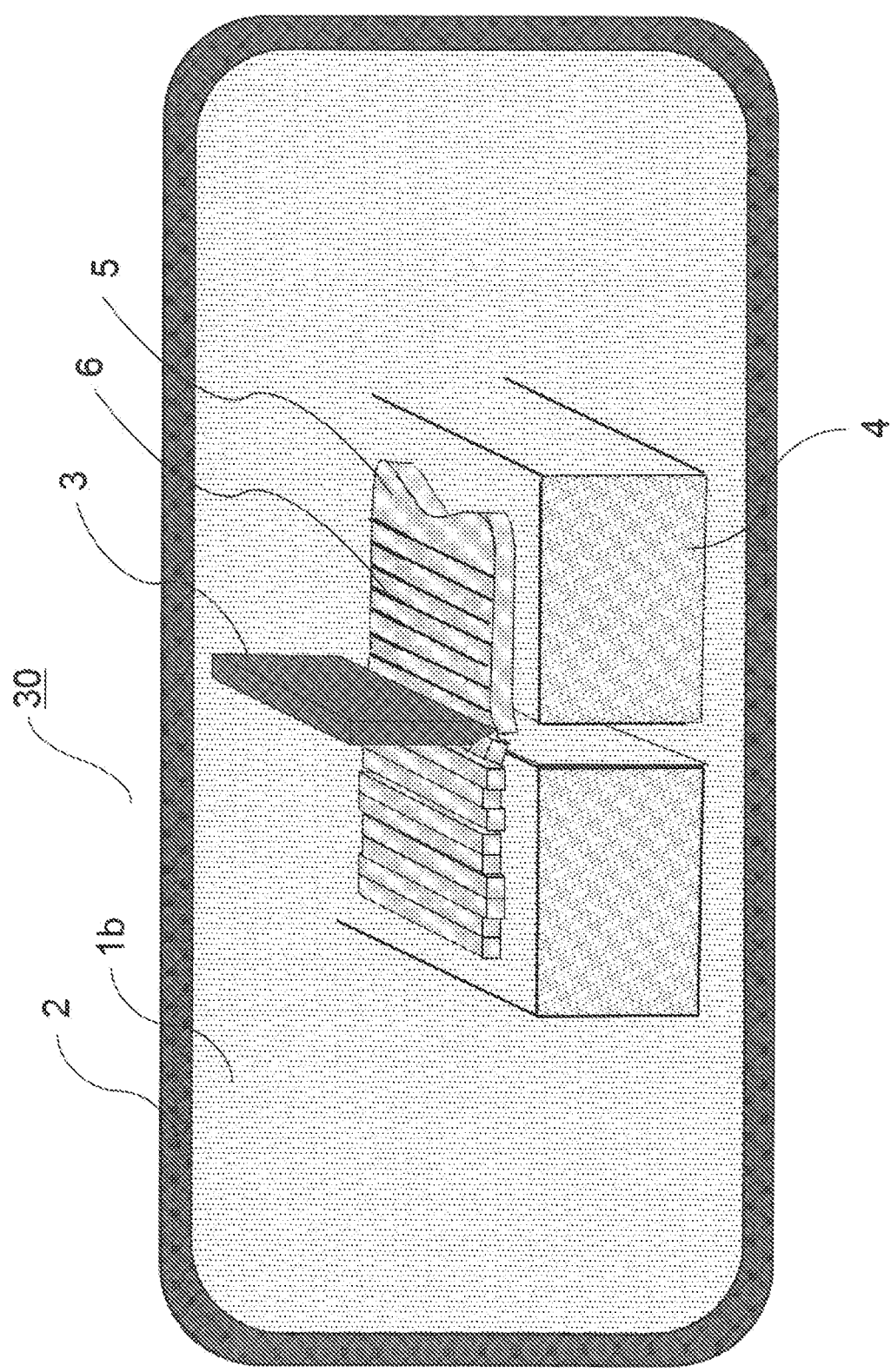
FIG. 5 is a conceptual diagram outlining an example of a semiconductor chip manufacturing device according to Embodiment 3.

FIG. 5 is a conceptual diagram outlining an example of a semiconductor chip manufacturing device according to Embodiment 3 in which semiconductor chips are manufactured from the semiconductor wafer 5 by using cleavage of crystal.

To be specific, FIG. 5 is a figure which shows the semiconductor chip manufacturing device 30 that is covered by the casing 2 in which a volatile liquid or a volatile fluid medium 1b (for example, ethanol, methanol or the like) is filled, at the time when the separation from a semiconductor wafer is performed by dividing it into bar states or into LD chips in which a plurality of LD chips is aligned side by side, by applying pressure onto the crack portion 6 using a blade cutting-edge and by utilizing cleavage of crystal while defining a crack formed inside the crystal as a starting point; and the device includes a mechanism which prevents the adhesion onto end faces of the semiconductor, whereby foreign substance having been caused is sunk onto the bottom face of the casing 2 by utilizing differences in specific gravity. Accordingly, it can be known that the semiconductor chip manufacturing device designates the device by which the semiconductor wafer 5 is divided into its portions using the reception stages 4 for supporting the semiconductor wafer 5, by applying pressure onto the crack portion 6 by means of the blade cutting-edge 3 and by performing cleavage of crystal while defining a crack formed inside the crystal as a starting point.

Also in Embodiment 3, end faces of LD chips reside in the fluid medium; and thus, the adhesion of foreign substance onto end faces of the LD chips can be curbed at the time when the separation from the semiconductor wafer is performed by dividing it into LD bar states or into LD chips in which a plurality of LD chips is aligned side by side so that the foreign substance is caused.

By producing LD chips by means of the semiconductor chip manufacturing device according to Embodiment 3, it becomes possible to reduce causing a visual defect due to the adhesion of foreign substance on end faces of the LD chips at a time of visual inspection thereon.

Embodiment 4

Figure 6:
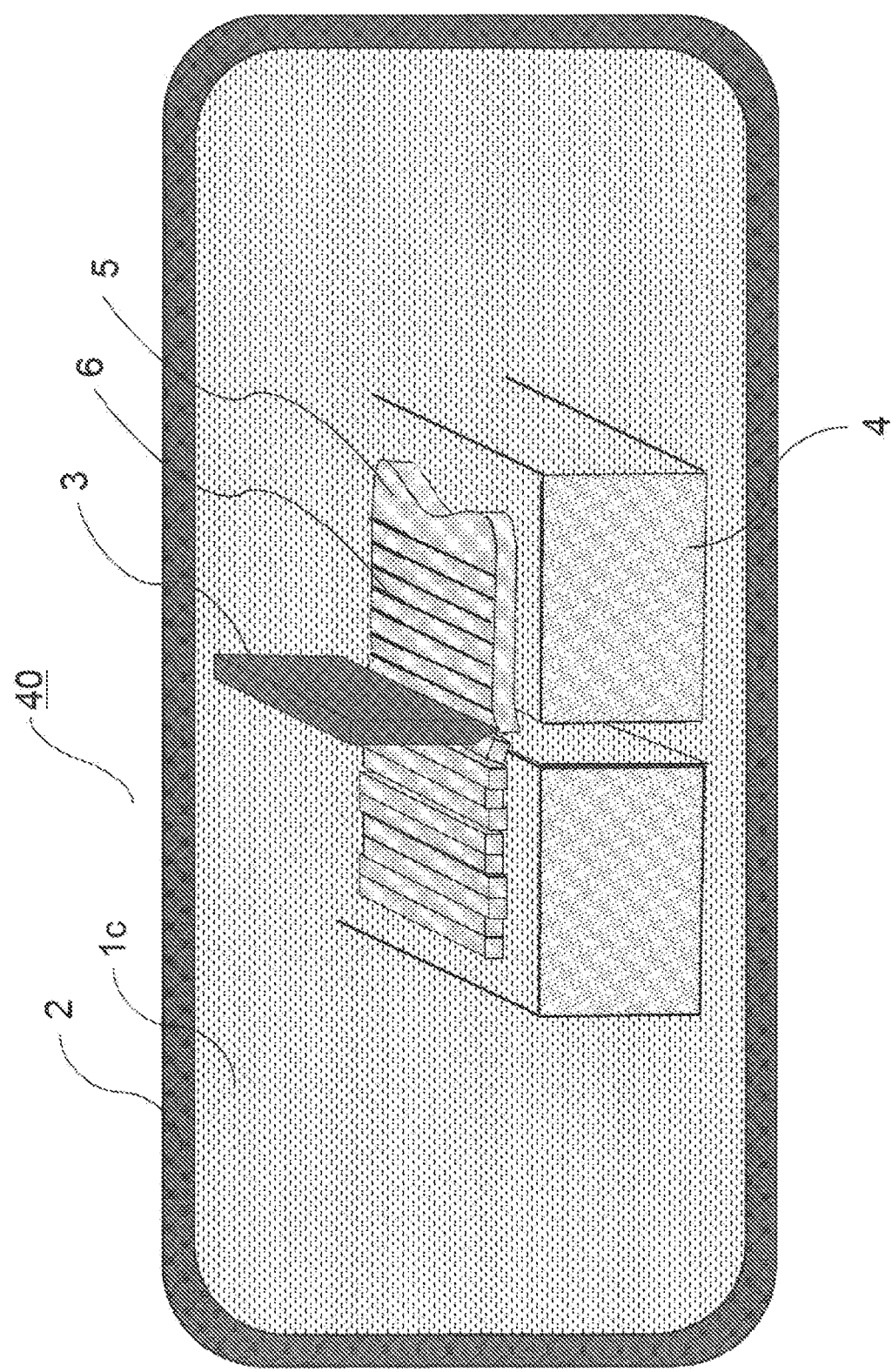
FIG. 6 is a conceptual diagram outlining an example of a semiconductor chip manufacturing device according to Embodiment 4.

FIG. 6 is a conceptual diagram outlining an example of a semiconductor chip manufacturing device according to Embodiment 4 in which semiconductor chips are manufactured from the semiconductor wafer 5 by using cleavage of crystal.

To be specific, FIG. 6 is a figure which shows the semiconductor chip manufacturing device 40 that is covered by the casing 2 in which a solution for cleaning Group II-VI compound semiconductors 1c (for example, ZnSe or ZnS) being a liquid or a fluid medium is filled in order to prevent oxidation of end faces of LD chips, at the time when the separation from a semiconductor wafer is performed by dividing it into bar states or into LD chips in which a plurality of LD chips is aligned side by side, by applying pressure onto the crack portion 6 using a blade cutting-edge and by performing cleavage of crystal while defining a crack formed inside the crystal as a starting point. In the manufacturing device, the device implements a mechanism which prevents the adhesion onto end faces of the semiconductor, whereby foreign substance having been caused is sunk onto the bottom face of the casing 2 by utilizing differences in specific gravity. Accordingly, it can be known that the semiconductor chip manufacturing device designates the device by which a semiconductor wafer is divided into its portions using the reception stages 4 for supporting the semiconductor wafer 5, by applying pressure onto the crack portion 6 by means of the blade cutting-edge 3 and by utilizing cleavage of crystal while defining a crack formed inside the crystal as a starting point.

Also in Embodiment 4, end faces of LD chips reside in the fluid medium; and thus, the adhesion of foreign substance onto end faces of the LD chips can be curbed at the time when the separation from the semiconductor wafer is performed by dividing it into LD bar states or into LD chips in which a plurality of LD chips is aligned side by side so that the foreign substance is caused. Moreover, at the same time, by dividing the semiconductor wafer in a solution for cleaning Group II-VI compound semiconductors (for example, ZnSe or ZnS) being a liquid or a fluid medium, oxidation of the end faces of the LD chips can be prevented.

By producing LD chips by means of the semiconductor chip manufacturing device according to Embodiment 4, it becomes possible to reduce causing a visual defect due to the adhesion of foreign substance on end faces of the LD chips at a time of visual inspection thereon, and in addition, an oxidation prevention effect on the end faces of the LD chips can be obtained.

Moreover, in all of the embodiments described above, the explanation has been made for the cases in each of which, at the time when the separation from a semiconductor wafer having a crystalline substance of sphalerite or zinc blende is performed by dividing it into LD bar states in which a plurality of LD chips is aligned side by side, pressure is applied onto the crack portion 6 by using a blade cutting-edge, and cleavage of crystal is performed while defining a crack formed inside the crystal as a starting point; however, it may also be suitable for a case in which the cleavage is performed on a semiconductor wafer having another crystalline substance, so that those effects similar to the effects described in the embodiments described above are achieved.

In the disclosure of the application concerned, various exemplary embodiments and implementation examples are described; however, various features, aspects and functions described in one or a plurality of embodiments are not necessarily limited to the applications of a specific embodiment(s), but are applicable in an embodiment(s) solely or in various combinations.

Therefore, limitless modification examples not being exemplified can be presumed without departing from the scope of the technologies disclosed in Description of the disclosure of the application concerned. For example, there arise cases which are included as a case in which at least one constituent element is modified, added or eliminated, and further a case in which at least one constituent element is extracted and then combined with a constituent element(s) of another embodiment.

EXPLANATION OF NUMERALS AND SYMBOLS

Symbol "1a" designates water; "1b," volatile fluid medium; "1c," solution for cleaning Group II-VI compound semiconductors; "2," casing; "3," blade cutting-edge; "4," reception stage; "5," semiconductor wafer; "6," crack portion; "7," scribed line; "8," block line; "9," flow of gaseous fluid; and "10," "20," "30," "40," semiconductor chip manufacturing device.

What is claimed is:
1. A semiconductor chip manufacturing device which produces a plurality of laser-diode chips by dividing a semiconductor wafer on which a visually identifiable block line is formed in advance and also on which a scribed line is inscribed so that a microcrack is formed along the scribed line, the semiconductor chip manufacturing device, comprising:
- a casing inside of which gaseous fluid is caused to flow in a fluid medium filling in the case along the scribed line;
- a blade cutting-edge for pressurizing a surface of the semiconductor wafer along a crack portion made of the block line of the semiconductor wafer or the scribed line thereof; and
- a reception stage including two portions separated from each other for supporting the semiconductor wafer on a surface on an opposite side to a surface where the blade cutting-edge pressurizes the semiconductor wafer, wherein
- the semiconductor wafer is divided into a plurality of laser-diode chips by pressurizing, by means of the blade cutting-edge, the semiconductor wafer along a crack portion thereof in the fluid medium in a region of the wafer opposite to a region between the separated two portions of the reception stage.

2. The semiconductor chip manufacturing device as set forth in claim 1, wherein the fluid medium is water.

3. The semiconductor chip manufacturing device as set forth in claim 1, wherein the fluid medium is a volatile fluid medium.

4. The semiconductor chip manufacturing device as set forth in claim 1, wherein the fluid medium is a solution for cleaning Group II-VI compound semiconductors.

5. A method of manufacturing semiconductor chips by which a plurality of laser-diode chips is produced by dividing a semiconductor wafer on which a visually identifiable block line is formed in advance and also on which a scribed line is inscribed so that a microcrack is formed along the scribed line, the method of manufacturing semiconductor chips, wherein
- the semiconductor wafer is supported by means of a reception stage including two portions separated from each other in a casing, inside of which a fluid medium is filled and a blade cutting-edge is placed along a crack portion made of the block line of the semiconductor wafer or the scribed line thereof, and a flow of gaseous fluid is generated to flow in the fluid medium along the scribed line, and also wherein
- the semiconductor wafer is divided into a plurality of laser-diode chips by pressurizing, by the blade cutting-edge, the semiconductor wafer along a crack portion thereof in the fluid medium in a region of the wafer opposite to a region between the separated two portions of the reception stage.

6. The method of manufacturing semiconductor chips as set forth in claim 5, wherein the fluid medium is made of water.

7. The method of manufacturing semiconductor chips as set forth in claim 5, wherein the fluid medium is made of a volatile fluid medium.

8. The method of manufacturing semiconductor chips as set forth in claim 5, wherein the fluid medium is made of a solution for cleaning Group II-VI compound semiconductors.

9. The method of manufacturing semiconductor chips as set forth in claim 1, wherein the blade cutting-edge is placed along a crack portion made of the block line of the semiconductor wafer.

10. The method of manufacturing semiconductor chips as set forth in claim 5, wherein the blade cutting-edge is placed along a crack portion made of the block line of the semiconductor wafer.

* * * * *